(12) United States Patent
Liu

(10) Patent No.: US 6,750,791 B1
(45) Date of Patent: Jun. 15, 2004

(54) METHOD AND DEVICE FOR TEXT DATA COMPRESSION

(75) Inventor: Zhigang Liu, Irving, TX (US)

(73) Assignee: Nokia Corporation, Espoo (FI)

( * ) Notice: Subject to any disclaimer, the term of this patent is extended or adjusted under 35 U.S.C. 154(b) by 0 days.

(21) Appl. No.: 10/361,805

(22) Filed: Feb. 7, 2003

(51) Int. Cl.$^7$ .............................................. H03M 7/30
(52) U.S. Cl. ......................................... 341/87; 341/51
(58) Field of Search .............................. 341/87, 65, 60, 341/51, 63, 67, 55; 382/240, 244; 707/1; 709/247; 375/240; 708/203

(56) References Cited

U.S. PATENT DOCUMENTS

| | | | |
|---|---|---|---|
| 4,494,150 A | * | 1/1985 | Brickman et al. .......... 375/240 |
| 4,906,991 A | * | 3/1990 | Fiala et al. .................... 341/51 |
| 5,414,650 A | * | 5/1995 | Hekhuis ...................... 708/203 |
| 5,680,130 A | * | 10/1997 | Tsutsui et al. ................. 341/87 |
| 6,388,584 B1 | | 5/2002 | Dorward et al. ............... 341/51 |
| 6,400,289 B1 | | 6/2002 | Banerji ......................... 341/60 |
| 6,411,227 B1 | | 6/2002 | Fish .............................. 341/65 |
| 6,415,061 B1 | | 7/2002 | Benayoun et al. .......... 382/253 |
| 6,434,168 B1 | | 8/2002 | Kari ............................ 370/521 |
| 6,459,392 B1 | * | 10/2002 | Haggar et al. ................. 341/87 |
| 6,577,254 B2 | * | 6/2003 | Rasmussen ................... 341/51 |

OTHER PUBLICATIONS

"Compression of Individual Sequences via Variable–Rate Coding", J. Ziv et al, *IEEE Transactions on Information Theory*, vol. IT–24, No. 5, Sep. 1978, pp. 530–536.

"A Universal Algorithm for Sequential Data Compression", J. Ziv et al, *IEEE Transactions on Information Theory*, vol. IT–23, No. 3, May 1977, pp. 337–343.

* cited by examiner

*Primary Examiner*—Jean Jeanglaude
(74) *Attorney, Agent, or Firm*—Ware, Fressola, Van Der Sluys & Adolphson LLP

(57) ABSTRACT

A method and device for compressing a text string into a compressed string, taking into account the case sensitivity of the text string. Compression can be performed in a lossy mode or a lossless mode. In lossy mode, the text string is parsed to determine its case sensitivity so that a search for finding a match for the text string in a reference source is based on the case sensitivity. Alternatively, the case configuration of the characters in the text string is transformed into a target case, and a case-sensitive search is performed in order to find a match for the case-transformed text string. In lossless mode, a case-insensitive search is performed for finding a match for the text string regardless of its case sensitivity, and a case-info-element is attached to the compressed string so that the compressed string can be reconstructed based on the case-info-element.

24 Claims, 8 Drawing Sheets

METHOD AND DEVICE FOR TEXT DATA COMPRESSION

FIELD OF THE INVENTION

The present invention relates generally to compression of text-based data or protocol data and, more specifically, to compression of data to be transmitted over networks having bandwidth limited communication links.

BACKGROUND OF THE INVENTION

In general, data compression converts data defined in a given format to another format containing fewer data bits than the original format. When the original data is needed, the compressed data is decompressed to restore the data to the original format. Data compression can be classified as lossy and lossless. As the term suggests, data is preserved during compression and decompression in a lossless method. Unlike lossless compression, lossy compression refers to methods in which the decompressed data is not exactly the same as the original data. Lossless data compression algorithms can be classified into dictionary coding and statistical coding types. The present invention is related to the dictionary coding type. The most widely used dictionary coding algorithms are the Lempel-Ziv algorithms and their variants. In particular, the LZ77 algorithm refers to the compression method as disclosed in Ziv et al. ("A Universal Algorithm for Sequential Data Compression",IEEE Transactions on Information Theory, Vol. IT-23, No.3, May 1977, pp.337–343) and the LZ78 refers to the method as disclosed in Ziv. et al. ("Compression of Individual Sequences via Variable Rate Coding",IEEE Transactions on Information Theory, Vol. IT-24, No.5, September 1978, pp.530–535). LZ77 is based on the principle of replacing a repeated sequence of characters by a reference to an earlier occurrence of the sequences by a pointer. LZ78 parses a stream of input data characters into coded values based on an adaptively growing reference source, such as a look-up table or dictionary, for string matching.

In many text-based applications and application protocols, some or all of the text data are case insensitive. In case-insensitive text data, the semantics of the text data are the same regardless of the texts being represented in lowercase or uppercase. For example, most HTTP (Hypertext Transfer Protocol) message header fields, including HTTP keywords, are case-insensitive. Thus, the URI (Uniform Resource Identifier) http://Nokia.com is equivalent to the URI HTTP://NOKIA.COM or http://nokia.com. In addition, if an HTTP message body contains an HTML (HyperText Markup Language) document, all element names and attribute names in the HTML documents are case insensitive. The Lempel-Ziv algorithms treat all data as pure bytes in their string match logic and, therefore, do not address the issue relating to case sensitivity. As a consequence, a string of texts in the input data will not be compressed even though the dictionary already contains the same string with a different case configuration. This not only limits the compression ratio, but also causes waste in the use of the dictionary and its memory storage. In particular, the problem affects compression performance in two scenarios: 1) a pre-populated dictionary with protocol or application specific data, such as keywords; and 2) application data generated by one source as dictionary to compress same application data generated by another source.

It is thus advantageous and desirable to provide a method and device for improving the compression ratio in text-based data compression.

SUMMARY OF THE INVENTION

It is a primary objective of the present invention to provide a method and device for efficiently compressing text-based data or protocol data.

According to the first aspect of the present invention, there is provided a method of coding communication data in a form of data segments for providing encoded data. The method is characterized by finding a match for a data segment in a reference source; and compressing the data segment for providing a compressed data segment in the encoded data if the match is found, wherein said finding is carried out in a manner based on case sensitivity of the data segment.

A data segment comprises at least one data unit and is either case sensitive or case insensitive. The data segment is case insensitive if said at least one data unit is case insensitive.

Advantageously, the method is further characterized by modifying the data segment if the data segment is case insensitive for providing a modified data segment so as to allow said finding to be based on a match for the modified data segment in the reference source.

When the data segment comprises a text string and each of said at least one data unit comprises a character, the character is either in a first case configuration or in a second case configuration, said method characterized in that said finding is carried out in a manner as if the data segment is case insensitive, and the method is further characterized by providing in the encoded data information indicative of the case configuration of the character in each of said at least one data unit so as to allow the compressed data segment to be decompressed based on the provided information.

When the text string comprises a number of characters, and the provided information comprises a number of data bits, each corresponding to one of said number of characters, each data bit is assigned a value indicative of whether the corresponding character is in the first case configuration or in the second case configuration.

Alternatively, the provided information comprises a code having a value indicative of the character in each of said at least one data unit being in a first case configuration. The first case configuration is lowercase and the second case configuration is uppercase. It is also possible that the first case configuration is uppercase and the second case configuration is lowercase.

Advantageously, the text string comprises a plurality of characters including a leading character and at least one following character, and the provided information comprises a code indicative of only the leading character in the text string being in a first case configuration.

According to the second aspect of the present invention, there is provided a compressor for encoding communication data in a form of data segments for providing encoded data. The compressor is characterized by a reference source;

a comparison means for finding a match of a data segment in the reference source; and an encoding module for compressing the data segment if the match is found for providing a compressed data segment in the encoded data, wherein the comparison means has a matching algorithm for finding the match based on case sensitivity of the data segment.

The compressor is further characterized by a parser, responsive to the data segment, for determining the case sensitivity of the data segment and for providing information indicative of the case sensitivity of the data segment to the comparison means, and the provided information is contained in a data flag conveyed to the comparison means.

Advantageously, the data segment comprises at least one character and each of said at least one character is either in a first case configuration or in a second case configuration. The compressor is further characterized by a transformer module, responsive to the data segment, for converting each of said at least one character in the data segment to a first case configuration for providing a case-transformed data segment to the comparison means so as to allow the comparison means to find the match in the reference source based on the case-transformed data segment.

Alternatively, when the data segment comprises at least one character and each of said at least one character is either in a first case configuration or in a second case configuration, the compressor is characterized in that the compressor finds the match of the data segment in the reference source as if the data segment is case insensitive, and that information indicative of the case configuration of each of said at least one character is provided in the encoded data so as to allow the compressed data segment from the encoded data to be decompressed based on the provided information.

According to the third aspect of the present invention, there is provided a communication component in a telecommunications network, adapted to receiving and transmitting communication data in a form of data segment. The component is characterized by a compressor for encoding the received communication data for providing encoded data for transmission, the compressor comprising:
a reference source;
an algorithm for finding a match of a data segment in the reference source; and
an encoding module for compressing the data segment if the match is found so as to provide a compressed data segment in the encoded data, wherein the algorithm finds the match based on case sensitivity of the data segment.

The communication component can be a mobile terminal or a support node in an infrastructure of the telecommunications network.

According to the fourth aspect of the present invention, there is provided data coding system for coding communication data in form of data segments. The system is characterized by:

a compressor for encoding the communication data, and
a decompressor for decoding encoded data, wherein the compressor comprises:
a reference source;
an algorithm for finding a match of a data segment in the reference source; and
an encoding module for compressing the data segment if the match is found so as to provide a compressed data segment, wherein the algorithm finds the match based on case sensitivity of the data segment, and wherein the decompressor comprises:
a further reference source, and
a further algorithm for finding the data segment from the further reference source.

The present invention will become apparent upon reading the description taken in conjunction with FIG.1a to 7.

BEST MODE FOR CARRY OUT THE INVENTION

The present invention provides two operation modes: lossy compression and lossless compression. In text-based data that contains both case-sensitive data segments and case-insensitive segments, only the case-insensitive segments are affected by lossy compression. The compression of case-sensitive data segments in Lossy Mode is the same as that in Lossless Mode. In Lossy Mode, the original case configuration of the case-insensitive segments may be lost during compression, but the semantics of the original data are unchanged. The compressor for the text-based data compression in Lossy Mode, according to the present invention, comprises a parser and an encoder. The parser is designed to have knowledge of the text data to be compressed and thus is able to determine whether a data segment is case-sensitive or case-insensitive. As with most data-compression methods, data segments in text-based data are subject to a search in a reference source, such as a dictionary, to find a match. Only the matched data segments are compressed before they are adapted into the data stream to be transmitted.

Lossy Mode

The Lossy Mode data compression method, according to the present invention, can be carried out in two compression procedures.

Procedure A:

Each byte in the input data goes through the parser so as to allow the parser to determine whether a text string is case-sensitive or case-insensitive.

The parser passes the byte to the encoder without modification.

The parser sets a case-insensitive flag, CI-flag, to TRUE if it determines the current byte belongs to a case-insensitive segment. Otherwise the CI-flag is FALSE.

The encoder performs a procedure of string matching for the text string based on the status of CI-flag.

Figure 1A:
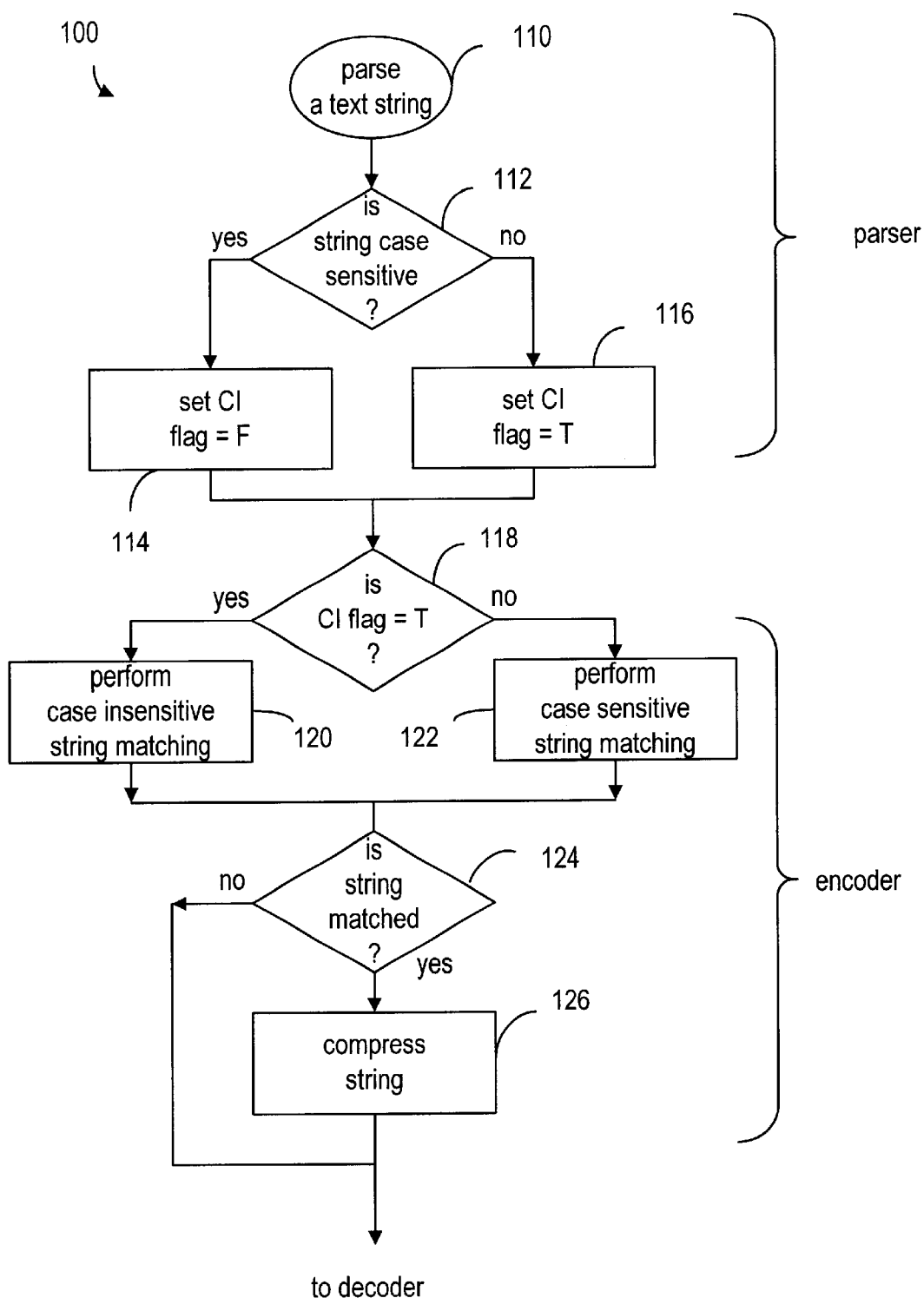
FIG. 1a is a flowchart illustrating a method of text-based data compression in Lossy Mode, according to the present invention.

This procedure is illustrated in the flowchart 100 of FIG. 1a. As shown, when a text string passes through the parser at step 110, the parser determines whether the string is case-sensitive or case-insensitive, at step 112. If the string is case-sensitive, the parser sets the CI-flag to FALSE at step 114. Otherwise it sets the flag to TRUE at step 116. The parser passes all the bytes in the string without modification to encoder along with the CI-flag. At step 118, the encoder examines the CI-flag. If the CI-flag is set to TRUE, the encoder performs a case-insensitive comparison in the procedure of string matching at step 120. Otherwise, the encoder performs a case-sensitive comparison at step 122. Only when a string is matched with an entry in the reference source, it will be compressed, as shown at steps 124 and 126.

With a string-matching algorithm that processes input data byte by byte, it is advantageous to extend the currently matched string, even though the CI-flag switches from one status to another.

In the flowchart 100 as shown in FIG. 1a, it is assumed that the parser and the encoder are separate modules in the compressor. In practice, it is advantageous to integrate the parser logic into the encoder. Accordingly, steps 114, 116 and 118 in the flowchart can be eliminated, as shown in the flowchart 100' of FIG. 1b.

Procedure B:

The input data passes through the parser.

If the parser determines the current byte belongs to a case-insensitive segment, it transforms the byte to a target case (e.g., lowercase).

The parser passes the "case-transformed" byte to the encoder.

The encoder compresses data delivered by the parser as if it is received directly from the input stream.

Figure 2:
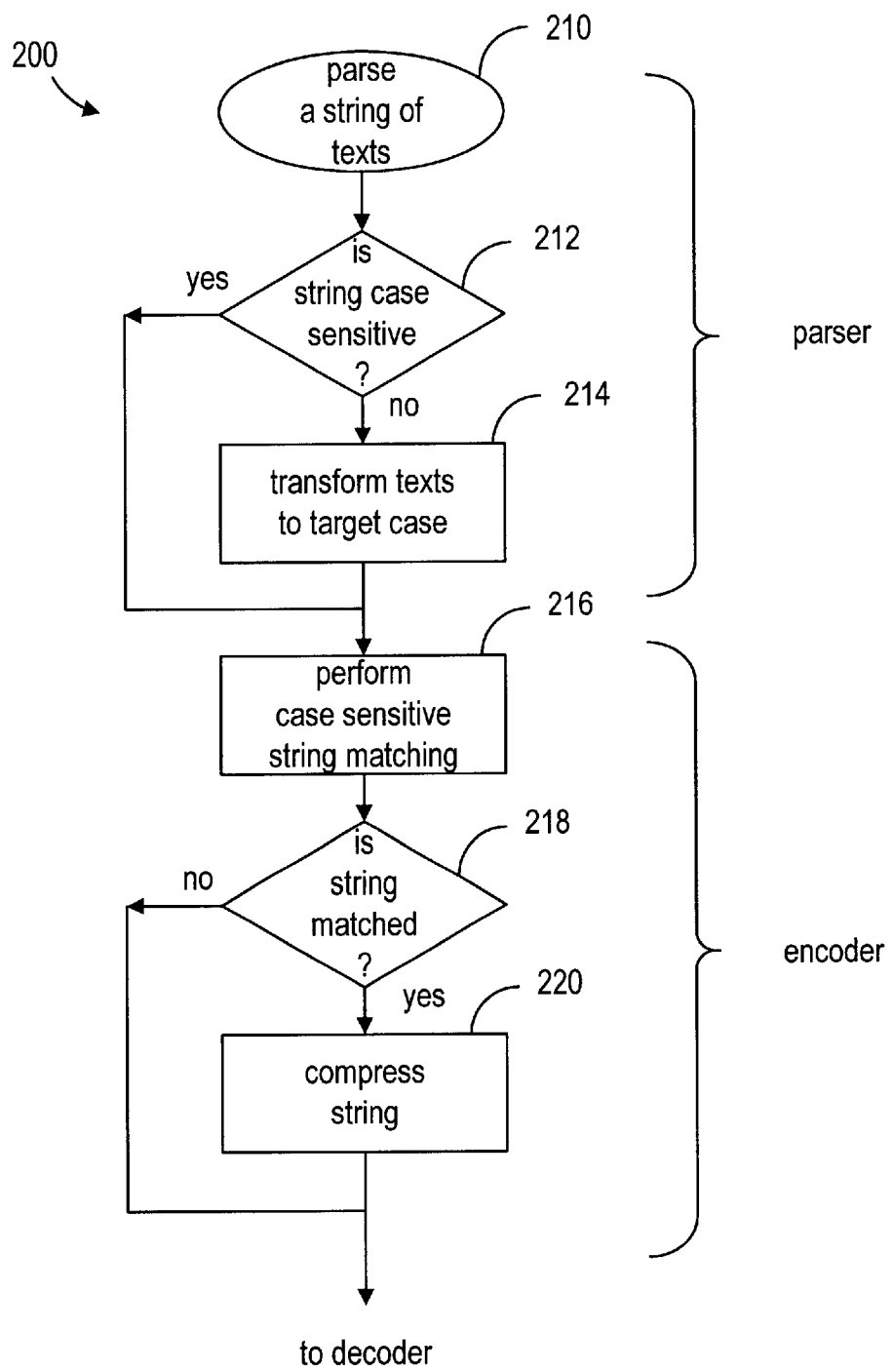
FIG. 2 is a flowchart illustrating another method of text-based data compression in Lossy Mode.

This procedure is illustrated in the flowchart 200 of FIG. 2. As shown, when a text string passes through the parser at step 210, the parser determines whether the string is case-sensitive or case-insensitive, at step 212. If the string is case-sensitive, the parser passes the string to the encoder without modifying the string. If the string is case insensitive, the parser transforms the string to a target case at step 214 and then passes the case-transformed string to the encoder. The encoder performs a case-sensitive comparison in the string matching procedure at step 216. Only when a string is matched with an entry in the reference source, it will be compressed, as shown at steps 218 and 220.

In comparison, Procedure B is preferable over Procedure A because the former does not require modification of existing encoders. However, the addition of the parser can be transparent to the encoder and, therefore, the modification is straightforward. As for case-transformation, the target case of a text string transformed by the parser should match the case configuration of the texts in a reference source, such as a pre-populated dictionary, when such a source is used for string matching.

Procedure A is advantageous when we prefer having the case configuration of a repeated text string being determined "naturally" by its first occurrence, either in the input data stream or in a pre-populated dictionary. For example, if a case-insensitive string "MyFavoriteSite" occurs before "myfavoritesite", the latter will become "MyFavoriteSite" after decompression in Procedure A.

The Lossy Mode compression method, as described in conjunction with FIGS. 1a to 2, is applicable to text-based compression with or without a pre-populated dictionary. In the case of having a pre-populated dictionary in the compressor and decompressor, the Lossy Mode compression method has an additional benefit of reducing the dictionary size. In case-insensitive compression, the same entry in the dictionary can be used to compress any string that consists of the same sequence of characters but with a different case configuration. For example, a string "abc" in the dictionary can be used to compress the strings "ABC","ABc","AbC", "aBC","Abc","aBc","abC" as well as "abc". Thus, the same string can be used to compress both the case-sensitive and case-insensitive text strings and, therefore only one copy of each text string needs to be stored in the dictionary.

Lossless Mode

Case sensitivity can also be exploited in order to improve the compression ratio using existing lossless compression algorithms, such as the LZ77 and LZ78 algorithm families. Unlike the lossy compression method where only the compressor treats case insensitive data segments and case-sensitive data segments differently, the decompressor in the lossless compression mode restores the compressed data based on case sensitivity provided by a mask.

Compressor Side—

In the compressor side, a case-insensitive string matching procedure is used to find a match of a text string in a reference source, such as a dictionary. As with existing compression procedures, the compressor encodes a string only when a match is found. Unlike existing compression procedures, a case-info-element is attached to the normal encoding element, which can be referred to as a base element. For example, the base element (offset, length) in the LZ77 algorithm family is now modified to become (offset, length, case-info-element), and the base element (codeword) in the LZ78 algorithm family is now modified to become (codeword, case-into-element). The case-info-element is used to carry information regarding the case configuration of the original string so as to allow a decompressor to reconstruct the original string, although the search for a matched string is based on the case configuration of the string in the dictionary. For example, if the input data contains a text string "tanglewood", a match can be found in a dictionary that contains a case-sensitive string "Tanglewood". With the case-info-element attached to the compressed string of "Tanglewood", the decompressor is able to know that the letter "t" is in lowercase.

Decompressor Side—

When the decompressor receives an encoded match, it fetches the matched string from its dictionary according to the information carried in the base-element (offset, length in LZ77 algorithm family; codeword in LZ78 algorithm family). The string fetched from the dictionary is a reference string. With the information carried in the case-info-element, the compressor adjusts the case configuration of the reference string so as to reconstruct the original string.

Figure 3:
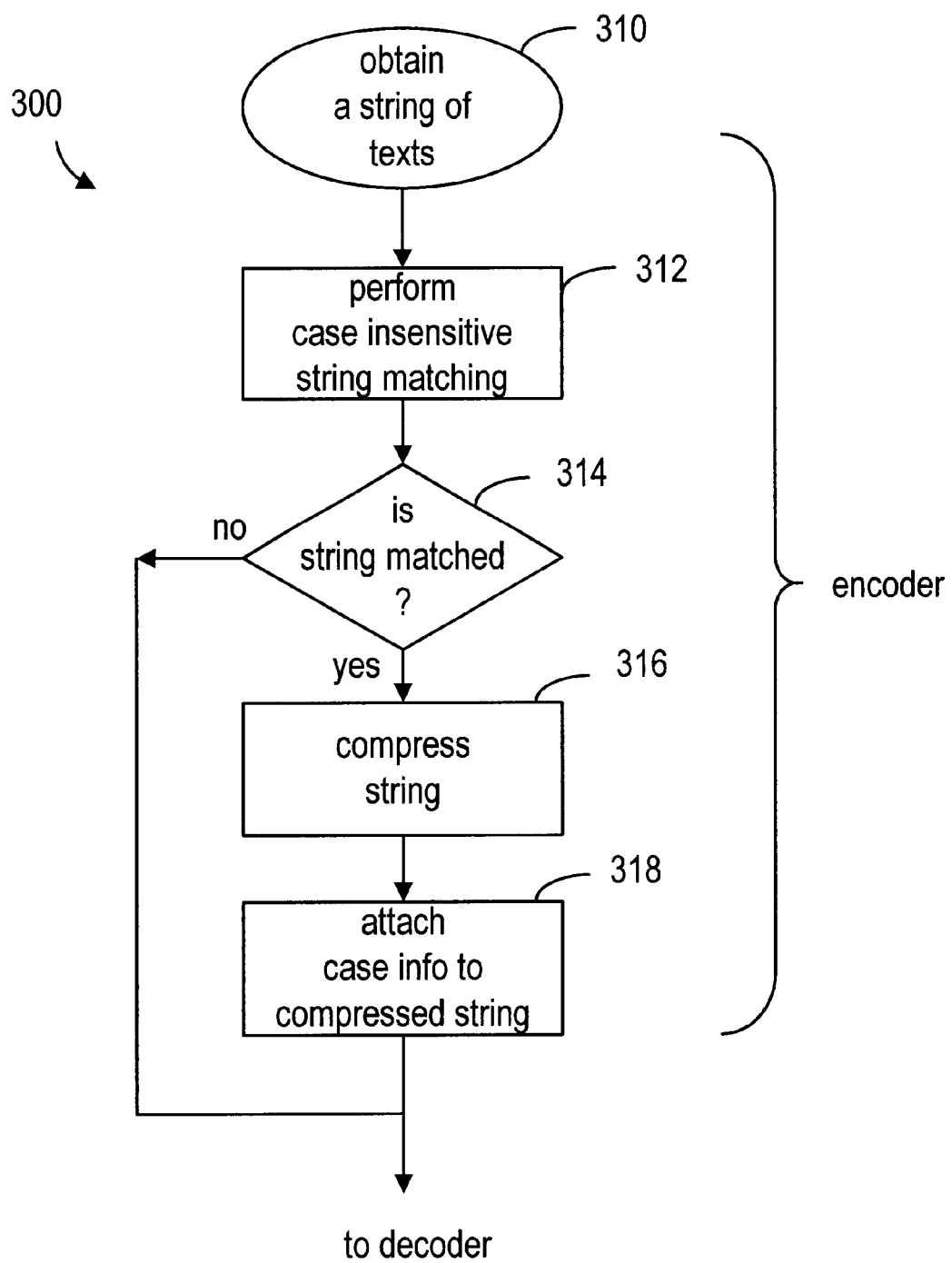
FIG. 3 is a flowchart illustrating a method of text-based data compression in Lossless Mode.

The Lossless Mode compression procedure, according to the present invention, is illustrated in FIG. 3. As shown in the flowchart 300, after the compressor obtains a text string in the input data at step 310, the compressor carries out a case-insensitive string matching procedure in order to find a match of the text string in a reference source at step 312. If a match for the string cannot be found in the reference source, then no compression is carried out. If a match is found as determined at step 314, then the string is compressed 316. A case-info-element carrying case configuration information is attached to the base element of the compressed string at step 318. Both the case-info-element and the base element are provided to a decoder for decompression.

Because of the relaxed criteria for string matching, more text-based data will be compressed. The cost to this benefit is the overhead to encode the case-info-elements. There are many different ways to encode a case-info-element. A simple way is to use an N-bit mask to carry the case information of an N-bit text string. In this approach, each of the bits in the mask indicates whether the character at the corresponding position of the original string is in lowercase or in uppercase. For example, a 4-bit mask 1010 indicates that the first and third characters are in uppercase while the second and fourth characters are in lowercase. Thus, with this mask, a reference string "abcd" as fetched from the dictionary can be reconstructed as "AbCd". With this approach, the length of the bit mask does not need to be encoded explicitly, because the decompressor can already derive this from the length of the decompressed string itself.

Alternatively, a variable length encoding method can be used to encode the case-info-element. For example, a single "0" bit can be used to indicate that the original string is exactly the same as the string fetched from the dictionary, and a 3-bit code can be used to indicate the differences in case configuration as follows:

100 all characters are in lowercase
    101 all characters are in uppercase
    110 all characters are in lowercase except the first one
    111 the case adjustment is carried out accordance with an N-bit mask that follows.

In this approach, the cost for indicating the case information is only one bit if the original string is exactly the same as the fetched string. For most other original strings that are different from the fetched strings by case configuration, the cost is three bits. In general, it is very infrequent to encounter a string such as MyFavoriteSite and the corresponding case-info-element of 111 followed by 10100000001000, assuming the dictionary contains an entry "myfavoritesite". Nevertheless, this case-info-element has a large overhead. In this case, the encoder can apply a certain cost analysis on the fly to decide whether an alternative method should be used. For example, because the bit-mask overhead regarding the string "MyFavoriteSite" is 14 bits in the character string plus the three bits in "111", the total encoded data length is (14+3+B)=(17+B) bits, where B is length of base element in unit of bits. The encoder can consider breaking up the string into three parts as (My) (Favorite)(Site) and encode these parts separately. Then, the total encoded data length (for these three separate parts) becomes (B+3)+(B+3)+(B+3) =(9+3*B) bits. Therefore, if B >4 bits (usually the case in practice), the former choice (i.e., encoding "MyFavoriteSite" as one unit) is better than the latter in terms of overall bit savings. It is interesting to note that in this example, a normal encoder without case-insensitive search would break the string into multiple parts as (M)(y)(F)(avorite)(S)(ite) and thus lead to a total encoded data length of (8+8+8+B+8+B) =(32+2*B) bits. Compared to (17+B) bits mentioned above, it shows the case-insensitive search saves (15+B) bits.

Furthermore, it is also possible to implement a switching scheme wherein the case-info-elements along with case-insensitive string matching are only used in certain sections of the input data stream, while all other sections are compressed using existing compression algorithm. By explicit and dynamic signaling at the stream level, one code point in the case-info-element can be reserved as a toggle switch between such sections. The switch allows the change of encoding on the fly in the compressed data stream. The decision to switch can be based on history. For example, if the compressor observes that using the case-info-element and case-insensitive comparison method does not improve the overall compression ratio, it may choose to switch to an existing algorithm where case-sensitive search is used without the case-info-element.

The explicit and dynamic signaling method can be implemented on a packet by packet basis. For example, if the input data is carried in a unit of packets and compression is also performed on a packet basis, the compressor may switch the encoding format between packets, but not within a packet. As such, the overhead for signaling is only 1 bit per packet. The decision to switch can also be based on history as discussed above. Alternatively, the compressor may try to compress each packet twice, once by an existing algorithm and once by the case-info-element method of the present invention, and then select the smaller of the two compressed packets for transmission. However, because this operation doubles the CPU cost, it should not be used where the CPU resource has higher priority over the bandwidth.

When the compressor and the decompressor each has a parser, an implicit and dynamic signaling method can be used. Because a parser can determine and indicate whether a current string belongs to a case-insensitive segment, it can be used as a switch to toggle between two encoding formats as discussed above. While this approach avoids explicit signaling between the compressor and decompressor, it requires a parser in each end.

Alternatively, Lossless Mode can be carried out implicitly and statically by using pre-agreed dictionary data. In this approach, only the string fetched from a certain part of the dictionary will be subject to a case-insensitive search and the compressed string has a case-info-element attached thereto. All other strings will be compressed using an existing algorithm. For example, in the LZ77 algorithm family, the criterion of offset<X can be used as a switch to toggle between the two encoding formats. With the LZ78 algorithm family, the codeword value can be used as such a switch.

Figure 1B:
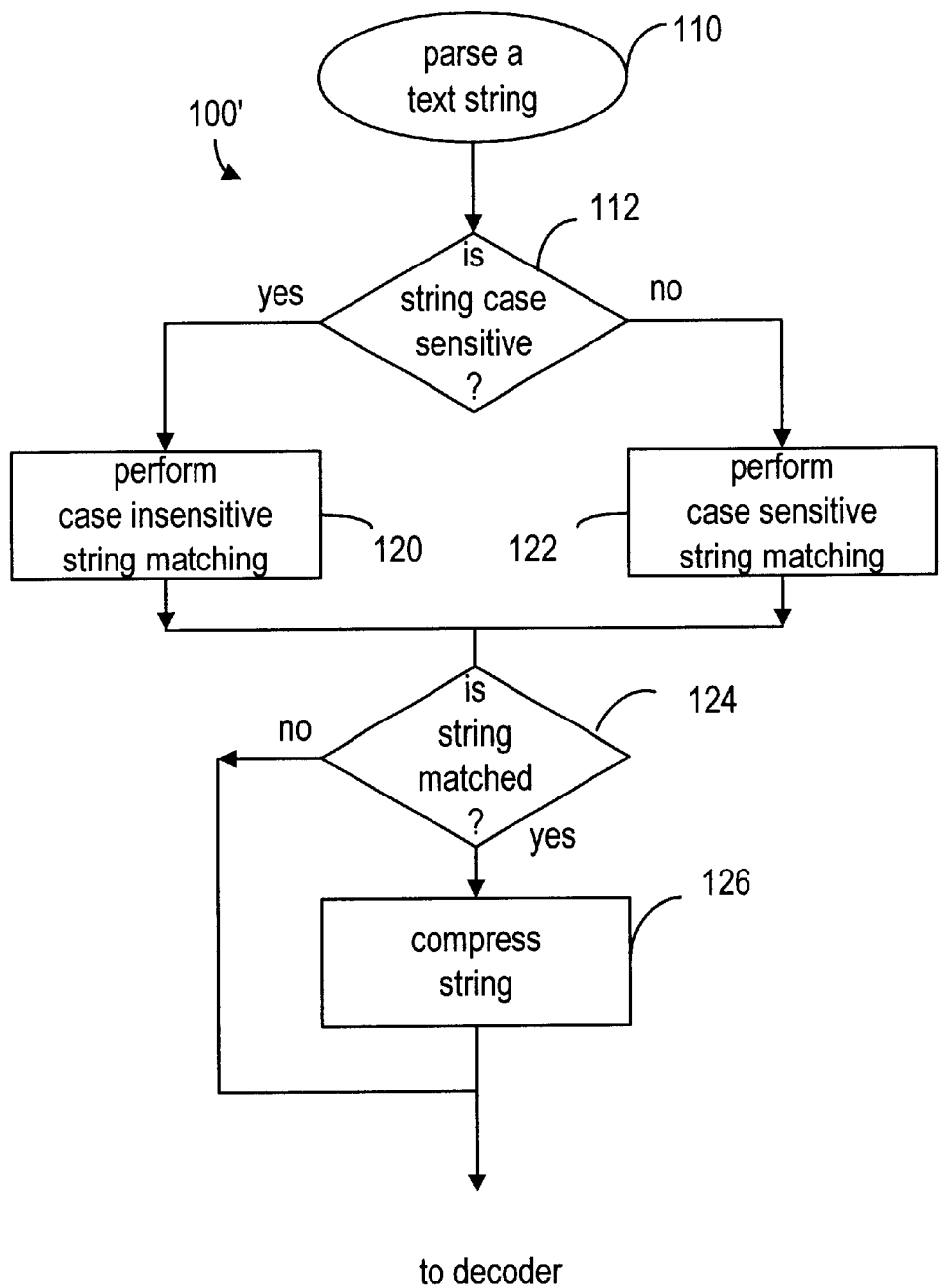
FIG. 1b is a flowchart illustrating another version of text-based data compression in Lossy Mode.
Figure 4:
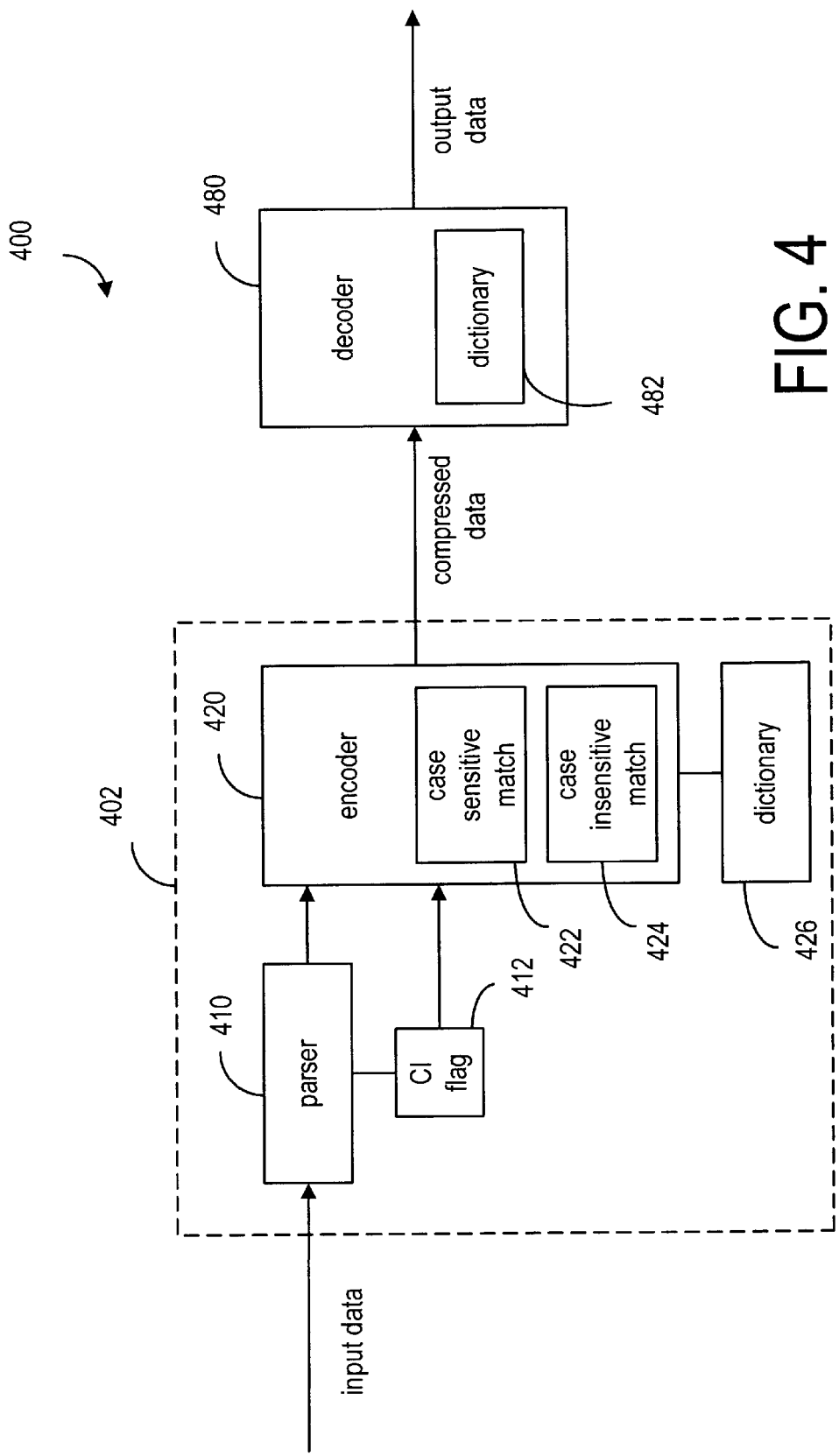
FIG. 4 is a block diagram showing a data coding system having a compressor for text-based data compression in Lossy Mode and a decompressor to reconstruct the original data, according to the present invention.

In order to carry out the lossy compression method as described in conjunction with FIGS. 1a and 1b, it is possible to use a compressor structure as shown in FIG. 4. As shown, a data coding system 400 includes a compressor 402, which comprises a parser 410 in order to determine whether a text string in the input data is case insensitive and sets the CI flag 412 accordingly. The parser 410 passes the input data, without modification, to an encoder 420. The encoder 420 comprises a case-sensitive match algorithm 422 and a case-insensitive match algorithm 424 so as to find a match for the input text string in a reference source 426 according to the CI-flag 412. If a match is found, then the text string is compressed by the encoder 420. Otherwise, the text string is not compressed. On the decompressor side, a decoder 480 simply fetches the text string from the dictionary 482 based on the compressed data.

Figure 5:
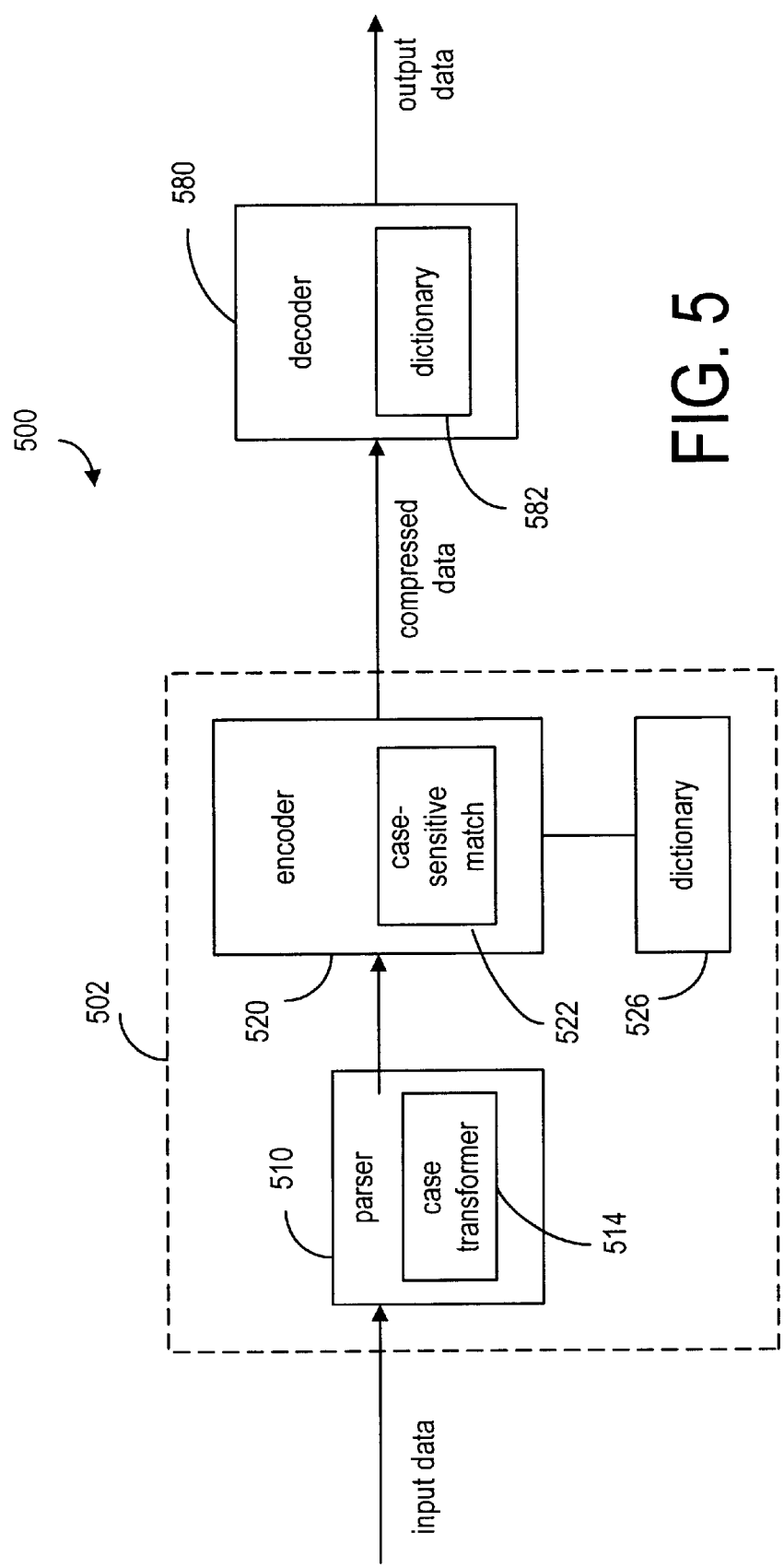
FIG. 5 is a block diagram showing another data coding system having a compressor for text-based data compression in Lossy Mode and a decompressor to reconstruct the original data.

The compressor capable of carrying out the lossy compression method as described in conjunction with FIG. 2, is shown in FIG. 5. As shown, the data coding system 500 includes a compressor 502, which comprises a parser 510, and a case transformer 514 to pre-process a data segment in the input data. If the parser 510 determines that the current byte belongs to a case-insensitive segment, the case transformer 514 transforms the byte to a target case. The case-transformed data is conveyed to an encoder 520. Unlike the encoder 420 as shown in FIG. 4, the encoder 520 has only the case-sensitive match algorithm 522 to find a match for a case-transformed text string in the reference source 526. The encoder 520 compresses the text string if a match is found. On the decompressor side, a decoder 580 simply fetches the text string from the dictionary 582 based on the compressed data.

Figure 6:
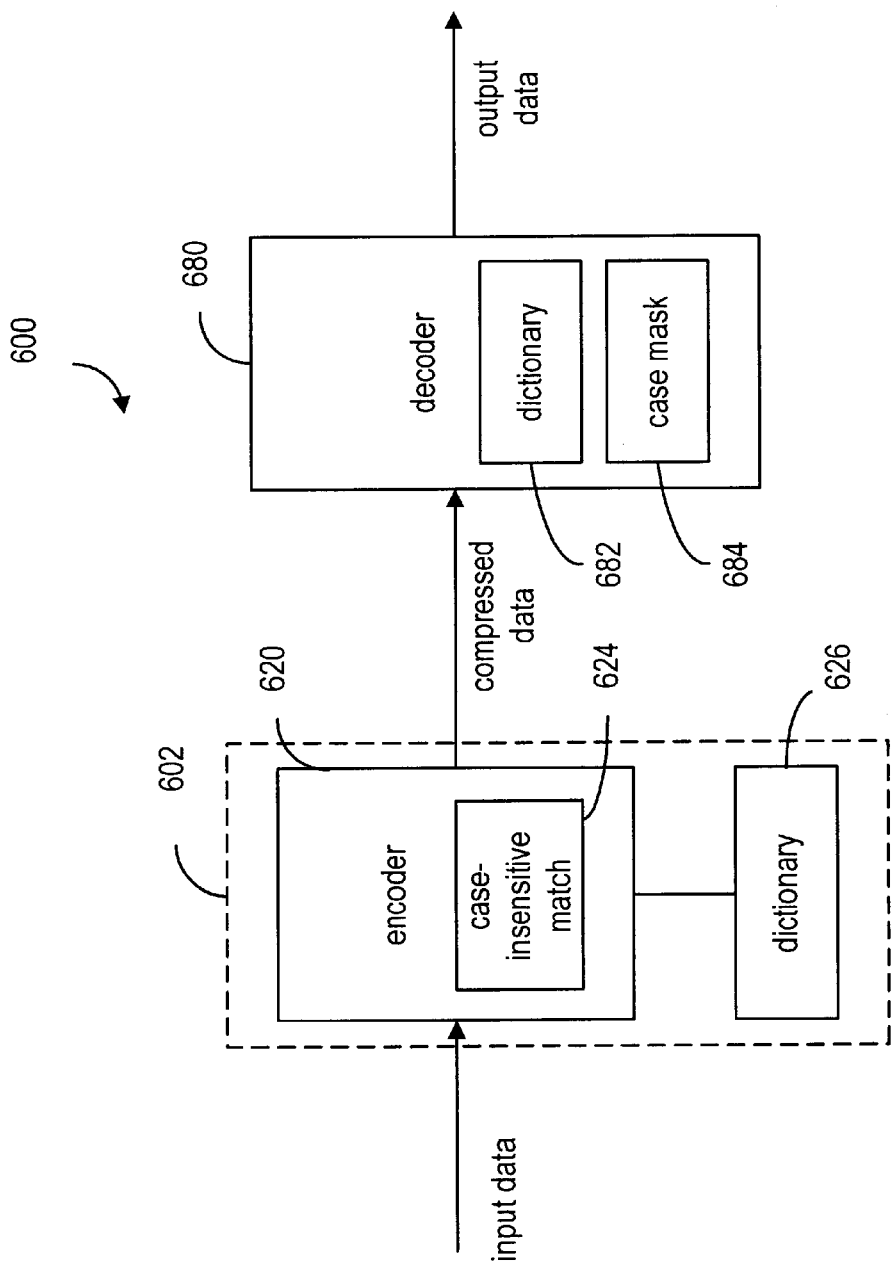
FIG. 6 is a block diagram showing a data coding system having a compressor for text-based data compression in Lossless Mode, and a decompressor to reconstruct the original data.

The lossless compression method, according to the present invention, can be carried out in a compressor as shown in FIG. 6. As shown, the data coding system 600 includes a compressor 602, which comprises encoder 620, using a case-insensitive match algorithm 624 for string matching. The encoder 620 attaches a case-info-element to the text string if a match is found so as to provide the base-element along with the case-info-element in the compressed data. On the decompressor side, a decoder 680 simply fetches the text string from the dictionary 682 based on the compressed data if no case-info-element is specified. Otherwise, after retrieving the text string, a case mask 684 based on the case-info-element is used to restore the case configuration of the original text string.

It should be noted that the data sent from the compressor side to the decompressor side may contain uncompressed data, which will be passed through the decoder without being decompressed. Furthermore, it is understood that the text string matched with a reference source by an encoder will be compressed using a certain algorithm to save transmission bandwidth. For example, the encoder may replace the input text string with a reference to the dictionary so as to allow the decoder to fetch the same text string based on the reference. How the reference is made depends on the algorithm and is beyond the scope of the present invention.

Figure 7:
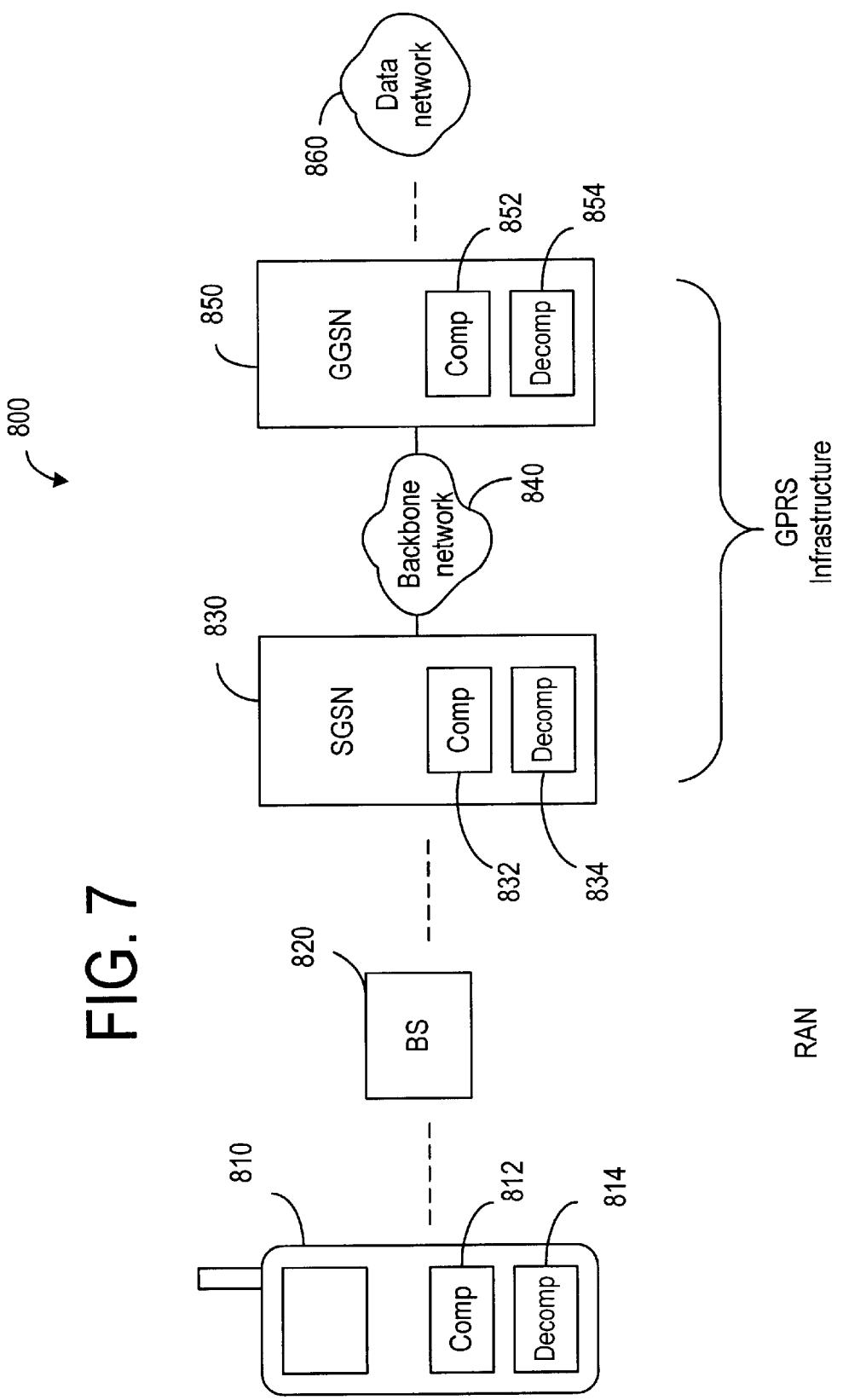
FIG. 7 is a schematic representation of a telecommunications network having a plurality of communication components that comprise the compressor, according to the present invention.

The present invention is useful when memory consumption in a device or the bandwidth in data transmission is critical. Thus, the lossy and lossless methods, according to the present invention, are particularly useful in compressing text-based Internet application data, such as HTML (HyperText Markup Language), MIME (Multipurpose Internet Mail Extensions) and application data such as HTTP (HyperText Transfer Protocol), RTSP (Real Time Streaming Protocol), SIP (Session Initiation Protocol). For example, the compressor as illustrated in FIGS. 4–6 can be implemented in various components in a telecommunications network shown in FIG. 7. As shown in FIG. 7, a GPRS (General Packet Radio Service) network 800 comprises a mobile terminal 810, a Base Station 820 in RAN (Radio Access Network), a SGSN (Serving GPRS Support Node) 830 and a GGSN (Gateway GPRS Support Node) 850 linked by a GPRS backbone network 840 in the GPRS Infrastructure to communicate with a Data Network 860. The mobile terminal 810 has a compressor 812 and a decompressor 814 to compress or decompress Internet data/messages. Likewise, the SGSN 830 has a compressor 832 and a decompressor 834, while the GGSN 850 has a compressor 852 and a decompressor 854. Note that usually only one of SGSN 830 or GGSN 850 has a compressor/decompressor pair. The compressors 812, 832 and 852 are similar to the compressors as described in conjunction with FIGS. 4, 5 and 6, using the methods as described in conjunction with FIGS. 1a, 1b, 2 and 3. Likewise, the decompressors 814, 834 and 854 are similar to the decompressors as described in conjunction with FIGS. 4, 5 and 6.

The methods of text-based data compression, according to the present invention, can improve existing data compression algorithms to achieve better compression ratio and less memory consumption. The major advantages of the Lossy Mode include: 1) higher compression ratio than that of existing algorithms and the Lossless Mode of the present invention; 2) low memory consumption for dictionary; 3) existing encoders can be used with minor or no modifications, and 4) compatibility with existing decoders. The major advantages of the Lossless Mode include: 1) Decompressed data is bit-wise identical to the original data; 2) higher compression ratio than that of existing algorithms; and 3) Existing encoders and decoders can be used with minor modifications.

It should be noted that the network components as depicted in FIG. 7 can be those in a UMTS (Universal Mobile Telecommunication System) packet network architecture. Accordingly, the mobile terminal 810 can be a UE (User Equipment); the Base Station 820 is a Node B in a UTRAN (UMTS Terrestrial radio access network); and SGSN 830 and GGSN 850 are 3G components in a UMTS Infrastructure.

Thus, although the invention has been described with respect to a preferred embodiment thereof, it will be understood by those skilled in the art that the foregoing and various other changes, omissions and deviations in the form and detail thereof may be made without departing from the scope of this invention.

What is claimed is:

1. A method of coding communication data in a form of data segments for providing encoded data, said method characterized by finding a match for a data segment in a reference source; and compressing the data segment for providing a compressed data segment in the encoded data if the match is found, wherein said finding is carried out in a manner based on case sensitivity of the data segment.

2. The method of claim 1, characterized in that a data segment comprises at least one data unit, wherein the data segment is either case sensitive or case insensitive, and wherein the data segment is case insensitive if said at least one data unit is case insensitive.

3. The method of claim 2, further characterized by modifying the data segment if the data segment is case insensitive for providing a modified data segment so as to allow said finding to be based on a match for the modified data segment in the reference source.

4. The method of claim 2, wherein the data segment comprises a text string and each of said at least one data unit comprises a character, the character is either in a first case configuration or in a second case configuration, said method characterized in that said finding is carried out in a manner as if the data segment is case insensitive, said method further characterized by providing in the encoded data information indicative of the case configuration of the character in each of said at least one data unit so as to allow the compressed data segment to be decompressed based on the provided information.

5. The method of claim 4, characterized in that the text string comprises a number of characters, and the provided information comprises a number of data bits, each corresponding to one of said number of characters, wherein each data bit is assigned a value indicative of whether the corresponding character is in the first case configuration or in the second case configuration.

6. The method of claim 4, characterized in that the provided information comprises a code having a value indicative of the character in each of said at least one data unit being in a first case configuration.

7. The method of claim 6, characterized in that the first case configuration is lowercase and the second case configuration is uppercase.

8. The method of claim 6, characterized in that the first case configuration is uppercase and the second case configuration is lowercase.

9. The method of claim 4, characterized in that the text string comprises a plurality of characters including a leading character and at least one following character, and the provided information comprises a code indicative of only the leading character in the text string being in a first case configuration.

10. The method of claim 9, characterized in that the first case configuration is uppercase and the second case configuration is lowercase.

11. A compressor for encoding communication data in a form of data segments for providing encoded data, said compressor characterized by
   a reference source;
   a comparison means for finding a match of a data segment in the reference source; and
   an encoding module for compressing the data segment if the match is found for providing a compressed data segment in the encoded data, wherein the comparison means has a matching algorithm for finding the match based on case sensitivity of the data segment.

12. The compressor of claim 11, further characterized by
   a parser, responsive to the data segment, for determining the case sensitivity of the data segment and for providing information indicative of the case sensitivity of the data segment to the comparison means.

13. The compressor of claim 12, characterized in that the provided information is contained in a data flag conveyed to the comparison means.

14. The compressor of claim 11, wherein the data segment comprises at least one character and each of said at least one character is either in a first case configuration or in a second case configuration, said compressor further characterized by
   a parser, responsive to the data segment, for determining the case sensitivity of the data segment, and
   a transformer module, responsive to the data segment, for converting each of said at least one character in the data segment to a first case configuration for providing a case-transformed data segment to the comparison means so as to allow the comparison means to find the match in the reference source based on the case-transformed data segment.

15. The compressor of claim 11, wherein the data segment comprises at least one character and each of said at least one character is either in a first case configuration or in a second case configuration, said compressor characterized in that
   the comparison means finds the match of the data segment in the reference source as if the data segment is case insensitive, and that
   information indicative of the case configuration of each of said at least one character is provided in the encoded data so as to allow the compressed data segment from the encoded data to be decompressed based on the provided information.

16. A communication component in a telecommunications network, adapted to receiving and transmitting communication data in a form of data segment, said component characterized by
   a compressor for encoding the received communication data for providing encoded data for transmission, the compressor comprising:
   a reference source;
   an algorithm for finding a match of a data segment in the reference source; and
   an encoding module for compressing the data segment if the match is found so as to provide a compressed data segment in the encoded data, wherein the algorithm finds the match based on case sensitivity of the data segment.

17. The communication component of claim 16, comprising a mobile terminal.

18. The communication component of claim 16, comprising a support node in an infrastructure of the telecommunications network.

19. A data coding system for coding communication data in form of data segments, said system characterized by:
   a compressor for encoding the communication data, and
   a decompressor for decoding encoded data, wherein the compressor comprises:
   a reference source;
   an algorithm for finding a match of a data segment in the reference source; and
   an encoding module for compressing the data segment if the match is found so as to provide a compressed data segment, wherein the algorithm finds the match based on case sensitivity of the data segment.

20. The data coding system of claim 19, characterized in that the decompressor comprises:
   a further reference source, and
   a further algorithm for finding the data segment from the further reference source.

21. The data coding system of claim 19, further characterized by
   a parser, responsive to the data segment, for determining the case sensitivity of the data segment and for providing information indicative of the case sensitivity of the data segment to the matching algorithm.

22. The data coding system of claim 21, characterized in that the provided information is contained in a data flag conveyed to matching algorithm.

23. The data coding system of claim 19, wherein the data segment comprises at least one character and each of said at least one character is either in a first case configuration or in a second case configuration, said compressor characterized by:
   a parser, responsive to the data segment, for determining the case sensitivity of the data segment, and
   a transformer module, responsive to the data segment, for converting each of said at least one character in the data segment to a first case configuration for providing a case-transformed data segment to the matching algorithm so as to allow the matching algorithm to find the match in the reference source base on the case-transformed data segment.

24. The data coding system of claim 19, wherein the data segment comprises at least one character and each of said at least one character is either in a first case configuration or in a second case configuration, said compressor characterized in that
   the compressor finds the match of the data segment in the reference source as if the data segment is case insensitive, and that
   information indicative of the case configuration of each of said at least one character is provided in compressed data so as to allow the compressed data segment from the compressed data to be decompressed based on the provided information.

* * * * *